(12) United States Patent
Lee et al.

(10) Patent No.: US 12,072,588 B2
(45) Date of Patent: Aug. 27, 2024

(54) DISPLAY DEVICE

(71) Applicant: Samsung Display Co., Ltd., Yongin-Si (KR)

(72) Inventors: Yoo Jeong Lee, Seoul (KR); Hyunseop Song, Bucheon-si (KR); Hakbum Choi, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 70 days.

(21) Appl. No.: 17/334,091

(22) Filed: May 28, 2021

(65) Prior Publication Data

US 2021/0384281 A1   Dec. 9, 2021

(30) Foreign Application Priority Data

Jun. 4, 2020   (KR) .................. 10-2020-0067668

(51) Int. Cl.
| | | |
|---|---|---|
| *G02F 1/1345* | (2006.01) | |
| *G02F 1/1362* | (2006.01) | |
| *H01L 23/00* | (2006.01) | |
| *H01L 25/18* | (2023.01) | |
| *H10K 59/131* | (2023.01) | |

(52) U.S. Cl.
CPC ...... *G02F 1/13458* (2013.01); *G02F 1/13452* (2013.01); *G02F 1/136286* (2013.01); *H01L 24/02* (2013.01); *H01L 24/05* (2013.01); *H01L 24/32* (2013.01); *H01L 24/98* (2013.01); *H01L 25/18* (2013.01); *H01L 2224/02141* (2013.01); *H01L 2224/04026* (2013.01); *H01L 2224/05552* (2013.01); *H01L 2224/05558* (2013.01); *H01L 2224/05686* (2013.01); *H01L 2224/32104* (2013.01); *H01L 2224/32225* (2013.01); *H01L 2924/0542* (2013.01); *H10K 59/131* (2023.02)

(58) Field of Classification Search
CPC ........................................ G02F 1/13452–13458
See application file for complete search history.

(56) References Cited

U.S. PATENT DOCUMENTS

2018/0076235 A1*   3/2018   Kim .................. G02F 1/13452

FOREIGN PATENT DOCUMENTS

| KR | 10-1345527 B1 | 12/2013 |
|---|---|---|
| KR | 10-2015-0105596 A | 9/2015 |
| KR | 10-1685020 B1 | 12/2016 |
| KR | 10-2019-0065757 A | 6/2019 |

* cited by examiner

*Primary Examiner* — Dung T Nguyen
(74) *Attorney, Agent, or Firm* — Innovation Counsel LLP

(57) ABSTRACT

A display device includes a substrate including a display area and a peripheral area surrounding the display area, a plurality of pads in a first direction of the peripheral area of the substrate and in a second direction perpendicular to the first direction, and a circuit film on the pads. Each of the pads includes a signal line on the substrate, a first dummy pattern on the substrate and spaced apart from the signal line in the first direction, and a first insulating pattern between the signal line and the first dummy pattern on the substrate.

11 Claims, 5 Drawing Sheets

FIG. 2
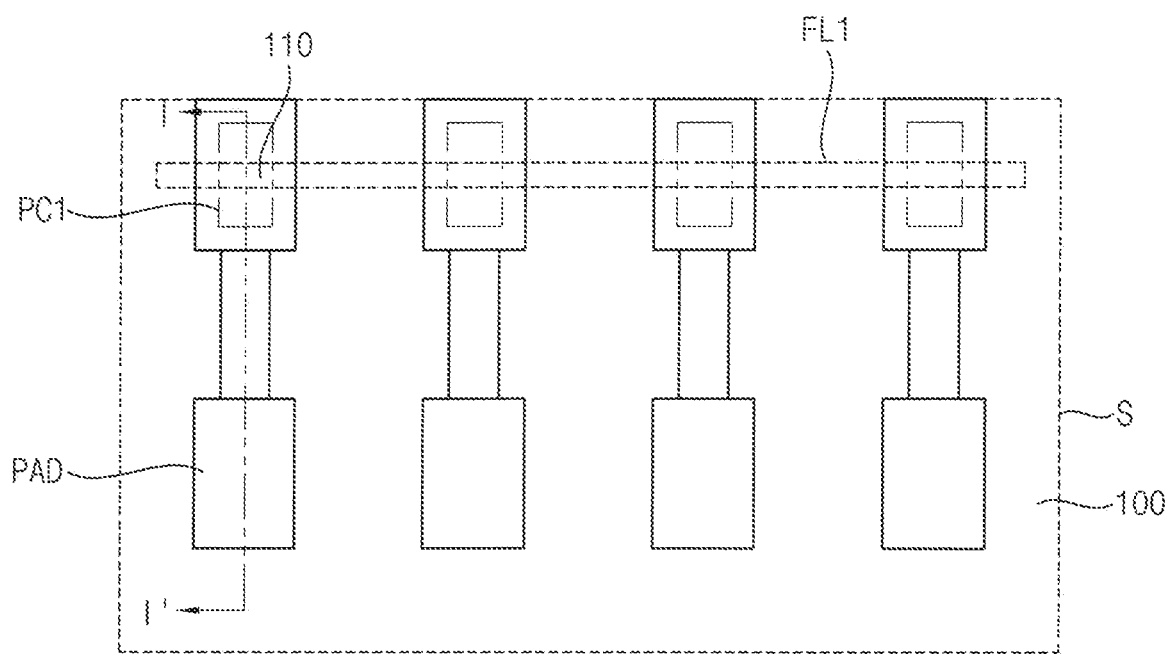
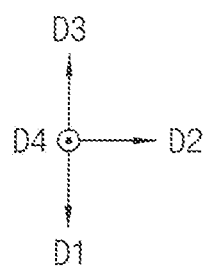

FIG. 4
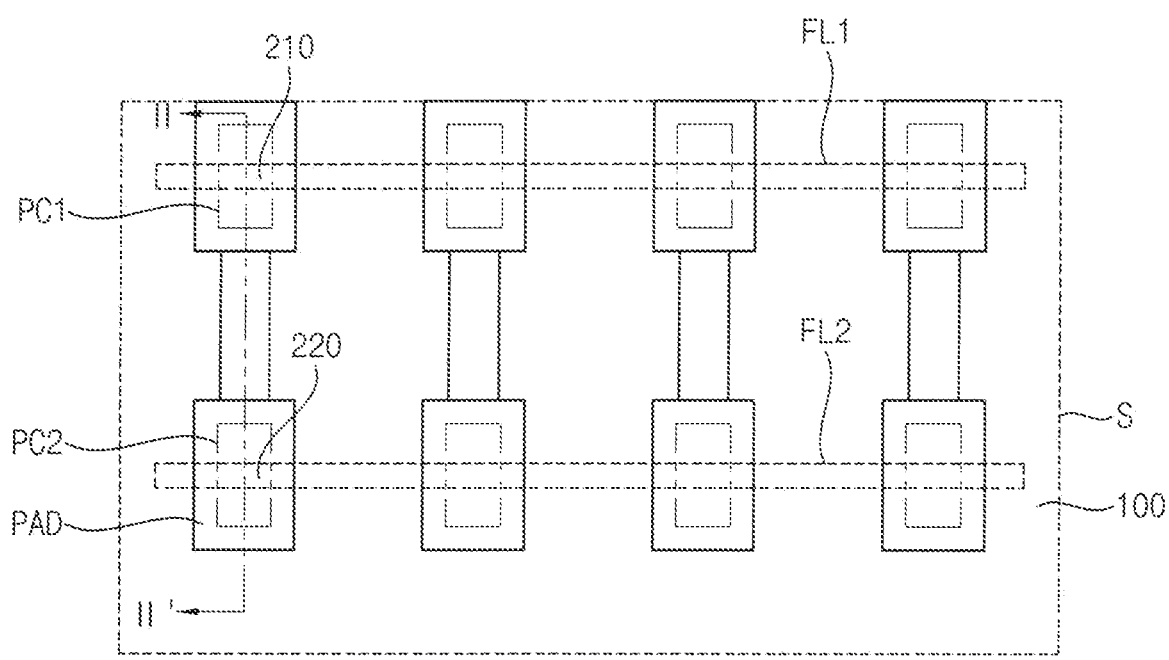
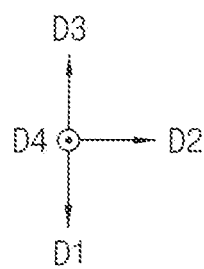

DISPLAY DEVICE

CROSS-REFERENCE TO RELATED APPLICATION(S)

This application claims priority under 35 USC § 119 to Korean Patent Application No. 10-2020-0067668, filed on Jun. 4, 2020 in the Korean Intellectual Property Office (KIPO), the content of which is incorporated herein in its entirety by reference.

BACKGROUND

1. Field

Embodiments of the present inventive concept relate to a display device, and more particularly to a display device with improved display quality.

2. Description of the Related Art

Recently, display devices have been produced in various forms. For example, display devices are being produced in the form of a liquid crystal display device, a plasma display device, and an organic light emitting display device.

Before being supplied to a user, the display device may undergo a rework process in which a circuit film attached to the display device is detached and then washed to improve a quality of the display device. When the circuit film is detached during the rework process, some of the lines may be peeled off together, resulting in a residue. A short circuit may occur due to the residue.

In addition, during the washing process of the display device, moisture or the like may penetrate into the display device through the lines. In this case, the short circuit may occur in the display device due to penetration of moisture.

SUMMARY

Some embodiments provide a display device with improved display quality.

According to embodiments, there is provided a display device including a substrate including a display area and a peripheral area surrounding the display area, a plurality of pads disposed in a first direction of the peripheral area of the substrate and arranged in a second direction perpendicular to the first direction, and a circuit film disposed on the pads. Each of the pads may include a signal line disposed on the substrate, a first dummy pattern disposed on the substrate and spaced apart from the signal line in the first direction, and a first insulating pattern disposed between the signal line and the first dummy pattern on the substrate.

In embodiments, the display device may further include a transmission line disposed between the display area and the signal line. The transmission line transfers a signal received from the signal line to the display area.

In embodiments, the signal line, the first dummy pattern, and the first insulating pattern may be disposed on a same layer. The first dummy pattern and the signal line may include a same material.

In embodiments, the first insulating pattern may be disposed on a virtual straight line extending from each of the pads in the second direction.

In embodiments, the display device may further include a second insulating pattern disposed on the signal line, a first organic pattern disposed on the second insulating layer, a third insulating pattern disposed on the first dummy pattern, a second organic pattern disposed on the third insulating pattern, and a conductive pattern covering the first organic pattern, the first insulating pattern, and the second organic pattern.

In embodiments, the conductive pattern may include zinc oxide.

In embodiments, the second insulating pattern and the first organic pattern may overlap the signal line. The third insulating pattern and the second organic pattern may overlap the first dummy pattern.

In embodiments, the display device may further include an anisotropic conductive film disposed between the conductive pattern and the circuit film and including conductive balls. The conductive pattern and the circuit film are connected by the anisotropic conductive film.

In embodiments, the conductive ball and the signal line may overlap.

In embodiments, each of the pads may extend in the first direction, and may have a concave 'I' shape in a middle portion of the first direction.

In embodiments, the display device may further include an integrated circuit disposed on the circuit film.

In embodiments, each of the pads may further include a second dummy pattern spaced apart from the first dummy pattern in the first direction on the substrate and a second insulating pattern disposed between the first dummy pattern and the second dummy pattern on the substrate.

In embodiments, the first dummy pattern, the second dummy pattern, the first insulating pattern, the second insulating pattern, and the signal line may be disposed on a same layer. The first dummy pattern, the second dummy pattern, and the signal line may include the same material.

In embodiments, the second insulating pattern may be disposed on a virtual straight line extending from each of the pads in the second direction.

In embodiments, the display device may further include a third insulating pattern disposed on the signal line, a first organic pattern disposed on the third insulating pattern, a fourth insulating pattern disposed on the first dummy pattern, a second organic pattern disposed on the fourth insulating pattern, a fifth insulating pattern disposed on the second dummy pattern, a third organic pattern disposed on the fifth insulating pattern, and a conductive pattern covering the first organic pattern, the first insulating pattern, the second organic pattern, the second insulating pattern, and the third organic pattern In embodiments, the third insulating pattern and the first organic pattern may overlap the signal line. The fourth insulating pattern and the second organic pattern may overlap the first dummy pattern. The fifth insulating pattern and the third organic pattern may overlap the second dummy pattern.

In embodiments, the conductive pattern may include zinc oxide.

In embodiments, the display device may further include an anisotropic conductive film disposed between the conductive pattern and the circuit film and including conductive balls. The conductive pattern and the circuit film are connected by the anisotropic conductive film.

In embodiments, the conductive ball and the signal line overlap.

As described above, the display device according to embodiments may include a plurality of pads including a signal line, a first dummy pattern disposed to be spaced apart from the signal line, and a first insulating pattern disposed between the signal line and the first dummy pattern. Also, the display device may include a circuit film connected to the plurality of pads by an anisotropic conductive film.

When the circuit film is detached from the plurality of pads, the signal line and the first dummy pattern are not separated by the first insulating pattern, and the circuit film may be removed. Accordingly, it is possible to prevent the plurality of pads from being short-circuited by a residue generated in a process of removing the circuit film.

In addition, the first dummy pattern may primarily block the penetration of moisture, and the first insulating pattern may secondarily block the penetration of the moisture. Accordingly, it is possible to prevent moisture from penetrating to the signal line.

BRIEF DESCRIPTION OF THE DRAWINGS

Illustrative, embodiments will be more clearly understood from the following detailed description in conjunction with the accompanying drawings.

FIG. 2 is a plan view illustrating an embodiment of a plurality of pads disposed in an area S of FIG. 1.

FIG. 4 is a plan view illustrating an embodiment of a plurality of pads disposed in an area S of FIG. 1.

DETAILED DESCRIPTION OF THE EMBODIMENTS

Hereinafter, embodiments of the present inventive concept will be explained in detail with reference to the accompanying drawings.

Figure 1:
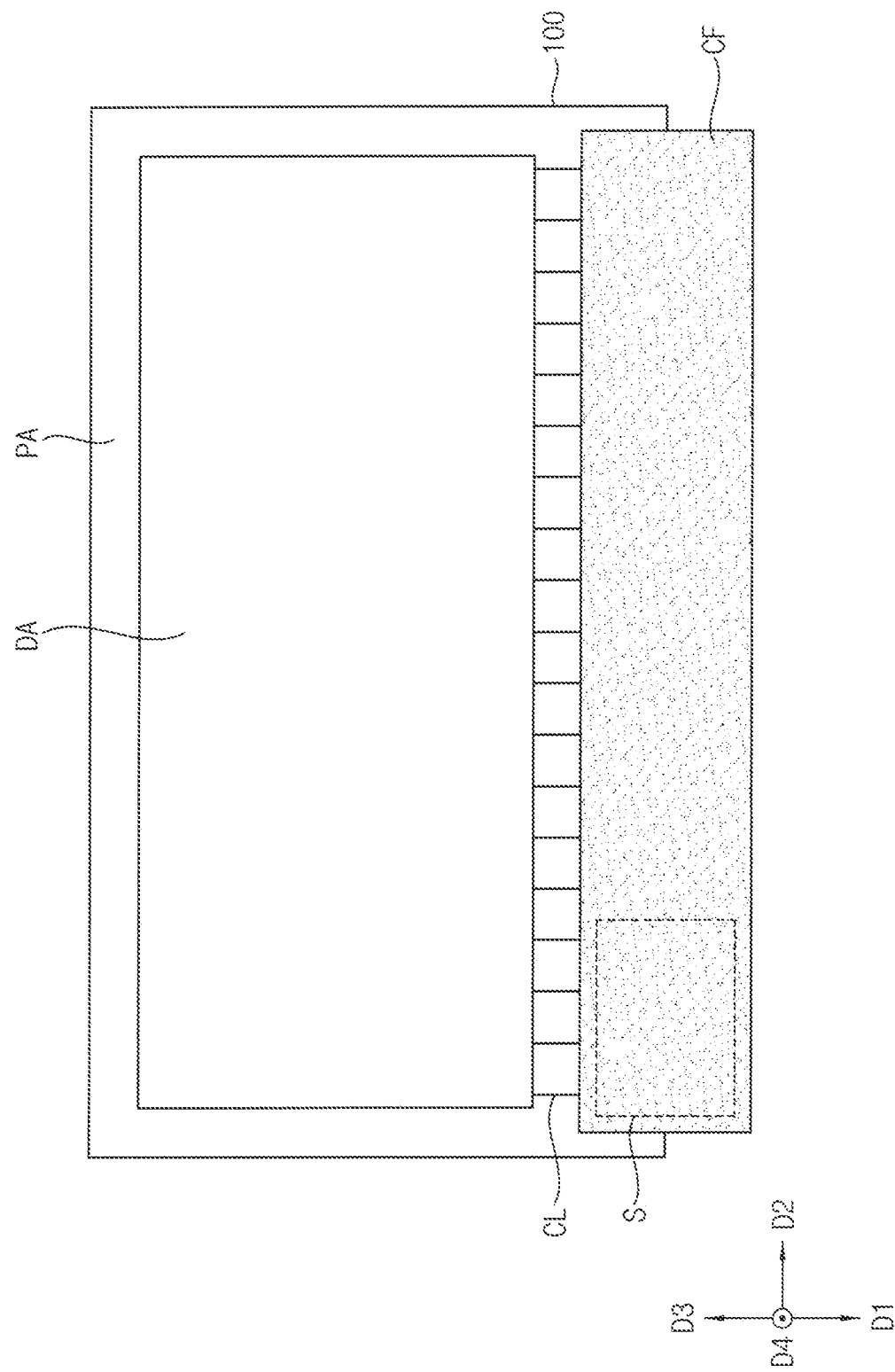
FIG. 1 is a plan view illustrating a display device according to an embodiment.

FIG. 1 is a plan view illustrating a display device according to an embodiment.

Referring to FIG. 1, the display device may include a substrate 100, a plurality of transmission lines CL, and a circuit film CF.

The substrate 100 may include a display area DA and a peripheral area PA surrounding the display area DA. In an embodiment, the substrate 100 may include glass, metal, or an organic material. For example, the substrate 100 may include a flexible material. The substrate 100 may include ultra-thin glass, metal, or plastic. For example, when plastic is used, the substrate 100 may include polyimide. However, the substrate 100 may include various other materials.

A plurality of pixels may be disposed in the display area DA. For example, the plurality of pixels may be generally disposed in the display area DA in a matrix form. The display device may display an image through the plurality of pixels. In an embodiment, the display device may be an organic light emitting display device. In an embodiment, the display device may be a liquid crystal display device. However, the display device may be various other display devices capable of displaying an image.

In the peripheral area PA, a data driver, a scan driver, a light emitting driver, and a driving controller may be disposed to transmit various signals to the display area DA.

FIG. 2 is a plan view illustrating an embodiment of a plurality of pads PAD disposed in an area S of FIG. 1.

Referring to FIGS. 1 and 2, the display device may include the plurality of pads PAD. The plurality of pads PAD may be disposed on the substrate 100. The plurality of pads PAD may be disposed in a first direction D1 of the peripheral area PA of the substrate 100. However, in an embodiment, the plurality of pads PAD are also disposed in the second direction D2 perpendicular to the first direction D1 of the peripheral area PA, the third direction D3 opposite to the first direction D1 and in a direction opposite to the second direction D2. The plurality of pads PAD may be spaced apart in the second direction D2. The plurality of pads PAD may transmit an external signal input from the circuit film CF to the display area DA.

The plurality of transmission lines CL may be connected to the plurality of pads PAD. The plurality of transmission lines CL may be disposed between the plurality of pads PAD and the display area DA. The plurality of transmission lines CL may transfer the external signal received from the plurality of pads PAD to the display area DA.

The plurality of pads PAD may extend in the first direction D1. In an embodiment, the plurality of pads PAD may have an "I" shape in which a middle portion of and in the first direction D1 is concave. In an embodiment, each of the plurality of pads PAD may include a first pad contact portion PC1 at an end portion of the plurality of pads PAD in the third direction D3. The external signal input from the circuit film CF through the first pad contact portion PC1 may be transmitted to the plurality of pads PAD. The structure of the first pad contact portion PC1 will be described later with reference to FIG. 3.

Since the plurality of pads PAD have the "I" shape, a contact area between a component disposed on the plurality of pads PAD and the plurality of pads PAD may be reduced. Accordingly, when a component disposed on the plurality of pads PAD is detached from the plurality of pads PAD, the component can be easily detached. Accordingly, when a component disposed on the plurality of pads PAD is detached from the plurality of pads PAD, it is possible to prevent a short circuit from occurring due to a peeling of the plurality of pads PAD.

For example, if a plurality of pads extending in the first direction D1 have a constant thickness in the second direction D2, a contact area between the pads and the circuit film CF may be increased compare to the plurality of pads PAD in accordance the inventive concept. In this case, during a detachment process of the circuit film CF, some of the plurality of pads may be peeled off together, thus generating a residue. The short circuit may occur in the display device due to the residue. On the other hand, the plurality of pads PAD according to an embodiment have the 'I' shape, thus preventing the occurrence of the residue and preventing a short circuit in the display device.

The circuit film CF may be disposed in the first direction D1 of the peripheral area PA of the display device. The circuit film CF may also be disposed in the second direction D2 of the peripheral area PA and the third direction D3 of the peripheral area PA. The circuit film CF may receive the external signal and transmit the external signal to the display area DA.

Figure 3:
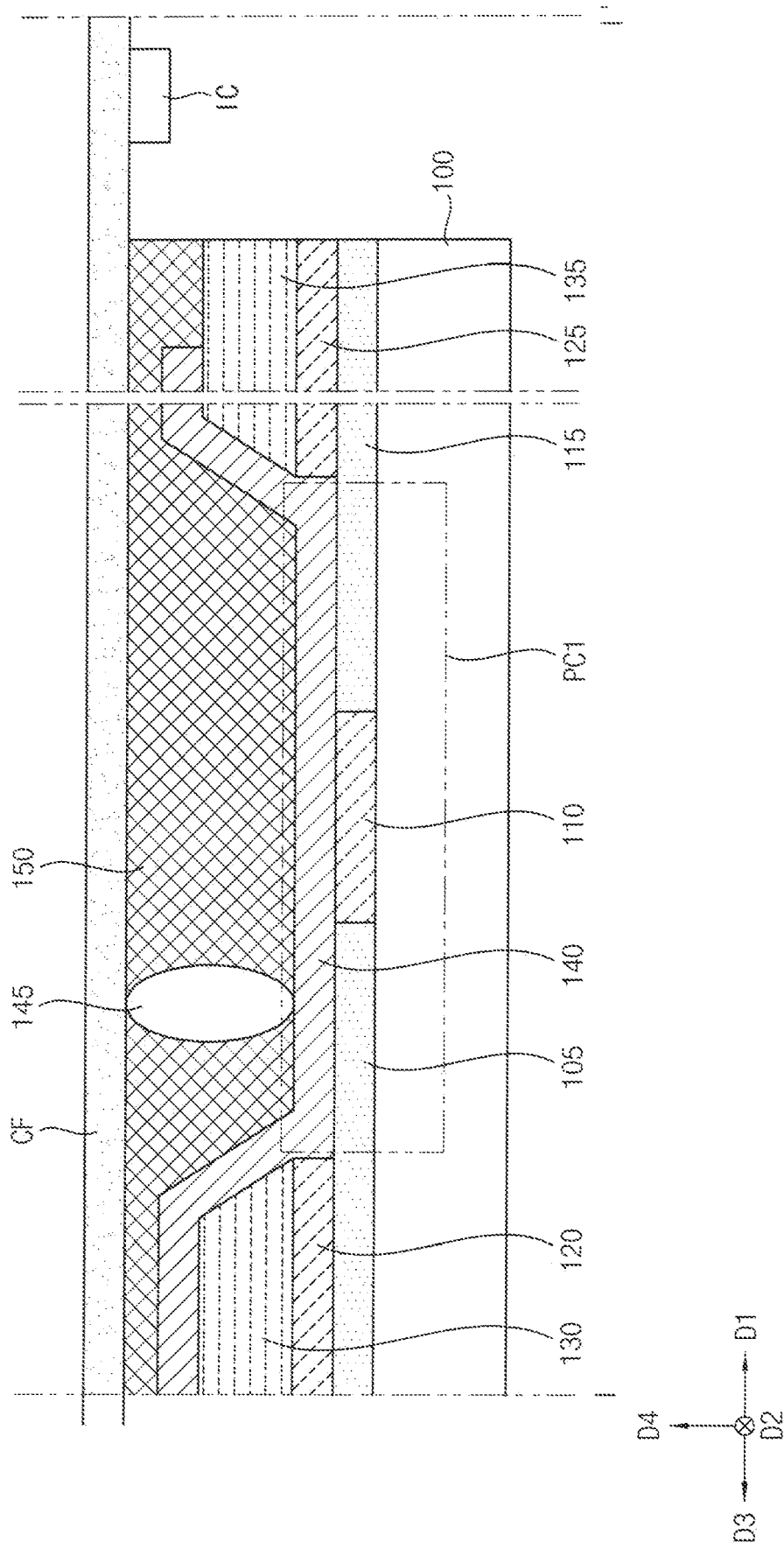
FIG. 3 is a cross-sectional view illustrating an embodiment cut along the line I-I' of FIG. 2.

FIG. 3 is a cross-sectional view illustrating an embodiment cut along the line I-I' of FIG. 2.

Referring to FIGS. 2 and 3, the display device may include the plurality of pads PAD, a second insulating pattern 120, a third insulating pattern 125, a first organic pattern 130, a second organic pattern 135, a conductive pattern 140, an anisotropic conductive film 150, and an integrated circuit IC. Each of the plurality of pads PAD may include a signal line 105, a first insulating pattern 110, and a first dummy pattern 115.

The signal line 105 may be disposed on the substrate 100. The signal line 105 may include a metal, an alloy, a metal nitride, a conductive metal oxide, a transparent conductive material, or the like. For example, the signal line 105 may be and/or include molybdenum ("Mo"), aluminum ("Al"), chromium ("Cr"), gold ("Au"), titanium ("Ti"), nickel ("Ni"), neodymium ("Nd"), copper ("Cu") and the like. The signal line 105 may be connected to the transmission line CL of FIG. 1. Accordingly, the signal line 105 may transfer the external signal received from the circuit film CF to the transmission line CL of FIG. 1.

The first dummy pattern 115 may be disposed to be spaced apart from the signal line 105 in the first direction D1. The first dummy pattern 115 may include a same material as the signal line 105. The first dummy pattern 115 may be formed by patterning a part of a conductive pattern after the conductive pattern including the signal line 105 is formed. That is, the first dummy pattern 115 and the signal line 105 may be spaced apart from each other by the patterning. Since the first dummy pattern 115 and the signal line 105 are spaced apart, moisture penetrated from the end of the first dummy pattern 115 in the first direction D1 may not penetrate to the signal line 105.

The first insulating pattern 110 may be disposed in a space where the first dummy pattern 115 and the signal line 105 are spaced apart. The first insulating pattern 110 may be disposed on each of the plurality of pads PAD on an imaginary straight line FL1, sometimes called the virtual straight line FL1, extending in the second direction D2. The first insulating pattern 110 may be disposed to be spaced apart on the virtual straight line FL1. The first insulating pattern 110 may overlap the first pad contact portion PC1. In an embodiment, the first insulating pattern 110 may include silicon nitride ("SiNx"). However, the first insulating pattern 110 may further include various other materials having insulating properties. For example, the first insulating pattern 110 may further include silicon oxide ("SiO2"), silicon oxynitride ("SiOxNy"), or the like. As the first insulating pattern 110 is disposed between the first dummy pattern 115 and the signal line 105, moisture penetrated from the first dummy pattern 115 may not penetrate to the signal line 105.

In addition, since the first insulating pattern 110 is disposed between the first dummy pattern 115 and the signal line 105, the circuit film CF may be easily detached from the display device. Conventionally, the signal line 105 extends to an end portion of the substrate 100 in the first direction D1 of each of the plurality of pads PAD. Accordingly, when the circuit film CF is detached from the display device, there is a problem in that the signal line 105 is peeled off. In the display device according to an embodiment, after patterning the signal line 105, the first insulating pattern 110 may be disposed in a space generated by the patterning. Accordingly, when the circuit film CF is detached from the display device, only the second insulating pattern 110 may be detached together. That is, peeling of the signal line 105 and peeling of the first dummy pattern 115 may be prevented.

In an embodiment, the signal line 105, the first insulating pattern 110, and the first dummy pattern 115 may be disposed on a same layer.

The second insulating pattern 120 may be disposed on the signal line 105. The second insulating pattern 120 may overlap the signal line 105. The second insulating pattern 120 may include the same material as the first insulating pattern 110. The insulating patterns to be described below may also include the same material as the first insulating pattern 110. An area to which the signal line 105 is exposed may be reduced due to the second insulating pattern 120. Accordingly, when the circuit film CF is detached from the display device, the signal line 105 may be prevented from being peeled off.

The third insulating pattern 125 may be disposed on the first dummy pattern 115. The third insulating pattern 125 may overlap the first dummy pattern 115. An area to which the circuit film CF and the first dummy pattern 115 are exposed may be reduced due to the third insulating pattern 125. Accordingly, when the circuit film CF is detached, the first dummy pattern 115 may be prevented from being peeled off.

As the second insulating pattern 120 and the third insulating pattern 125 are spaced apart from each other, the first pad contact portion PC1 exposing a part of the signal line 105, a part of the first dummy pattern 115, and the first insulating pattern 110 may be formed. The external signal transmitted from the circuit film CF through the first pad contact portion PC1 may be transmitted to the signal line 105.

The first organic pattern 130 may be disposed on the second insulating pattern 120. The first organic pattern 130 may overlap the second insulating pattern 120. The second organic pattern 135 may be disposed on the third insulating pattern 125. The second organic pattern 135 may overlap the third insulating pattern 125. The first organic pattern 130 and the second organic pattern 135 may include an organic material. For example, the organic material may include acrylic resin, epoxy resin, phenol resin, polyimide resin, and the like. As the first and second organic patterns 130 and 135 and the second and third insulating patterns 120 and 125 are disposed to overlap each other, moisture penetrating into the upper surface of the display device may be effectively prevented.

The conductive pattern 140 may cover the first insulating pattern 110, the first organic pattern 130, and the second organic pattern 135. In an embodiment, the conductive pattern 140 may include a transparent metal material. For example, the conductive pattern 140 may include zinc oxide. In addition, the conductive pattern 140 may be selected from indium zinc oxide ("IZO"), zinc oxide ("ZnO"), and any combination IZO and ZnO. However, other materials can be included in the conductive pattern 140. For example, the conductive pattern 140 may include tin oxide. The conductive pattern 140 may prevent the signal line 105 from directly contacting the anisotropic conductive film 150. The conductive pattern 140 may transmit the external signal received from the circuit film CF to the signal line 105.

The anisotropic conductive film 150 may be disposed on the conductive pattern 140. The anisotropic conductive film 150 may connect the conductive pattern 140 and the circuit film CF. The anisotropic conductive film 150 may include conductive balls 145, a single conductive ball 145 being illustrated in FIG. 3 and discussed below. The conductive ball 145 may overlap the signal line 105. After the external signal transmitted from the circuit film CF is transmitted to the conductive pattern 140 through the conductive ball 145, the external signal may be transmitted to the signal line 105. Since the conductive ball 145 overlaps only the signal line 105, the external signal may not be transmitted to the first dummy pattern 115. Accordingly, a short circuit caused by the external signal flowing through the first dummy pattern 115 may be prevented.

The circuit film CF may be disposed on the anisotropic conductive film 150. The circuit film CF may receive the external signal. In an embodiment, the integrated circuit IC may be disposed on the circuit film CF. For example, the integrated circuit IC may be disposed on the bottom surface of the circuit film CF without overlapping the plurality of pads PAD. However, in an embodiment, the integrated circuit IC may be disposed on the upper surface of the circuit film CF without overlapping the plurality of pads PAD. In addition, the integrated circuit IC may be disposed on the upper surface of the circuit film CF while overlapping the plurality of pads PAD.

FIG. 4 is a plan view illustrating an embodiment of a plurality of pads PAD disposed in the area S of FIG. 1.

Referring to FIGS. 1 and 4, the plurality of pads PAD may be disposed on the substrate 100. The plurality of pads PAD may be disposed in a first direction D1 of the peripheral area PA of the substrate 100. The plurality of pads PAD may be disposed in the second direction D2. The plurality of pads PAD may transmit the external signal to the display area DA. In an embodiment, the plurality of transmission lines CL may be disposed between the plurality of pads PAD and the display area DA. The plurality of transmission lines CL may transmit the external signal received from the plurality of pads PAD to the display area DA. In an embodiment, each of the plurality of pads PAD may include the first pad contact portion PC1 at an end portion of the plurality of pads PAD in the third direction D3. Each of the plurality of pads PAD may include a second pad contact portion PC2 at an end portion in the first direction D1. The external signal input to the circuit film CF through the first pad contact portion PC1 may be transmitted to the plurality of pads PAD. A description of the first pad contact portion PC1 and the second pad contact portion PC2 will be described later with reference to FIG. 5.

Figure 5:
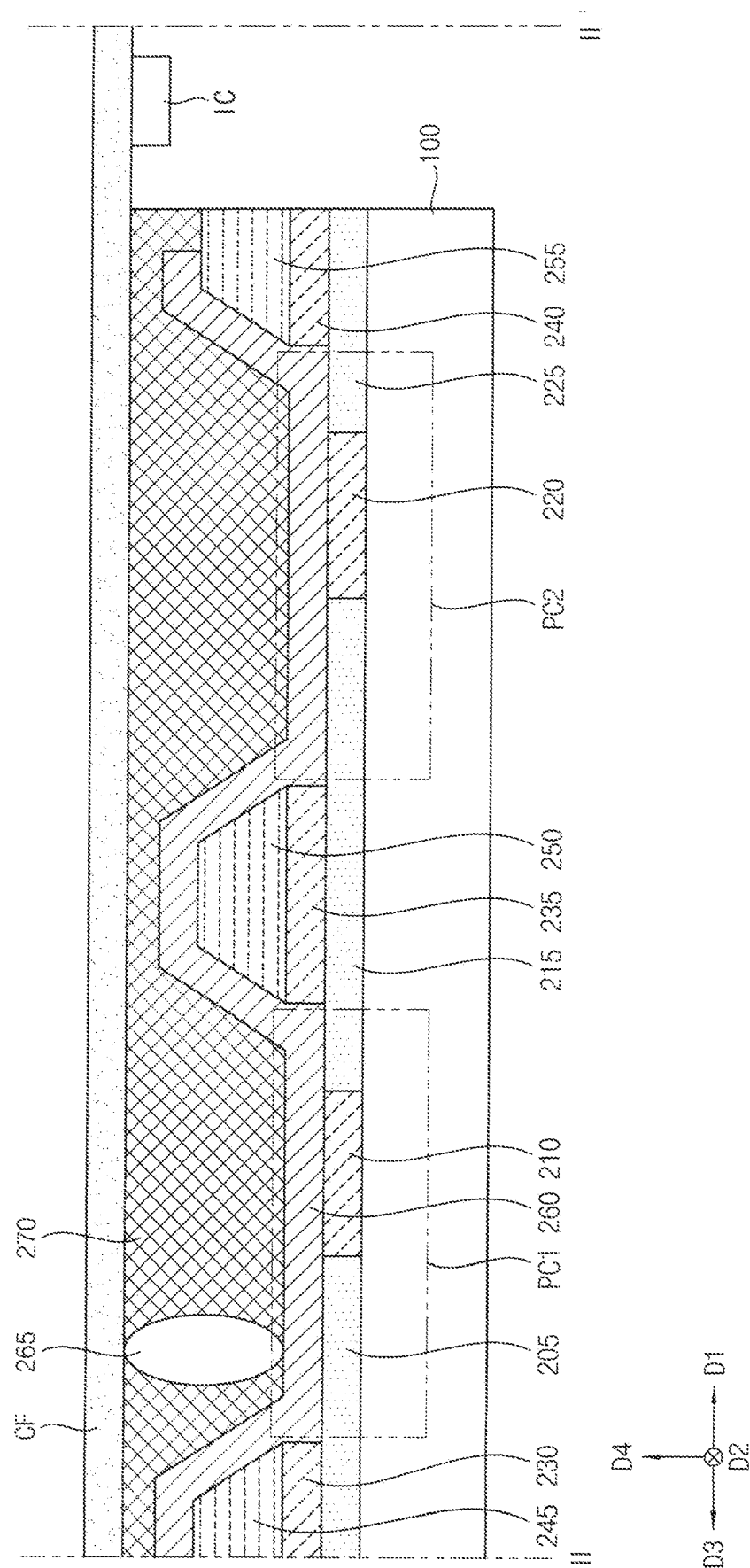
FIG. 5 is a cross-sectional view illustrating an embodiment cut along the line II-II' of FIG. 4.

FIG. 5 is a cross-sectional view illustrating an embodiment cut along the line II-II' of FIG. 4.

Referring to FIGS. 4 and 5, the display device may include the plurality of pads PAD, a third insulating pattern 230, a fourth insulating pattern 235, a fifth insulating pattern 240, a first organic pattern 245, a second organic pattern 250, a third organic pattern 255, a conductive pattern 260, and an anisotropic conductive film 270. Each of the plurality of pads PAD may include a signal line 205, a first insulating pattern 210, a first dummy pattern 215, a second insulating pattern 220, and a second dummy pattern 225.

The signal line 205 may be disposed on the substrate 100. The signal line 205 may include a metal, an alloy, a metal nitride, a conductive metal oxide, a transparent conductive material, or the like. The signal line 205 may be connected to the transmission line CL of FIG. 1. Accordingly, the signal line 205 may transfer the external signal received from the circuit film CF to the transmission line CL of FIG. 1.

The first dummy pattern 215 may be disposed to be spaced apart from the signal line 205 in the first direction D1. The first dummy pattern 215 may include a same material as the signal line 205. Since the first dummy pattern 215 and the signal line 205 are spaced apart from each other, moisture penetrated from the end of the first dummy pattern 215 in the first direction D1 may not penetrate to the signal line 205.

The first insulating pattern 210 may be disposed in a space where the first dummy pattern 215 and the signal line 205 are spaced apart from each other. The first insulating pattern 210 may be disposed on each of the plurality of pads PAD on an imaginary straight line FL1, sometimes called a virtual straight line FL1, extending in the second direction D2. The first insulating pattern 210 may be disposed to be spaced apart on the virtual straight line FL1. The first insulating pattern 210 may overlap the first pad contact portion PC1. As the first insulating pattern 210 is disposed between the first dummy pattern 215 and the signal line 205, moisture penetrated from the first dummy pattern 215 may not penetrate to the signal line 205.

In addition, since the first insulating pattern 210 is disposed between the first dummy pattern 215 and the signal line 205, the circuit film CF may be easily detached from the display device. Conventionally, the signal line 205 extends to an end portion of the substrate 100 in the first direction D1 of each of the plurality of pads PAD. Accordingly, when the circuit film CF is detached from the display device, there is a problem in that the signal line 205 is peeled off. In the display device according to an embodiment, after patterning the signal line 205, the first insulating pattern 210 may be disposed in a space generated by the patterning. Accordingly, when the circuit film CF is detached from the display device, only the first insulating pattern 210 may be detached together. That is, peeling of the signal line 205 and peeling of the first dummy pattern 215 may be prevented.

The second dummy pattern 225 may be disposed to be spaced apart from the first dummy pattern 215 in the first direction D1. The second dummy pattern 225 may include a same material as the signal line 205. The second dummy pattern 225 may be formed by patterning a part of the conductive pattern after the conductive pattern including the signal line 205 is formed. That is, the first dummy pattern 215 and the second dummy pattern 225 may be spaced apart from each other by the patterning. Since the first dummy pattern 215 and the second dummy pattern 225 are spaced apart, moisture penetrated from the end of the second dummy pattern 225 in the first direction D1 may not penetrate to the signal line 205.

The second insulating pattern 220 may be disposed in a space where the second dummy pattern 225 and the first dummy pattern 215 are spaced apart from each other. The second insulating pattern 220 may be disposed on each of the plurality of pads PAD on an imaginary straight line FL2, sometimes called a virtual straight line FL2, extending in the second direction D2. The second insulating pattern 220 may be disposed to be spaced apart on the virtual straight line FL2. The second insulating pattern 220 may overlap the second pad contact portion PC2. Since the second insulating pattern 220 is disposed between the first dummy pattern 215 and the second dummy pattern, moisture penetrated from the end of the second dummy pattern 225 in the first direction D1 may not penetrate to the signal line 205. Accordingly, short circuiting from the moisture is avoided and defects due to a burn occurring in the display device may be prevented.

In addition, since the second insulating pattern 220 is disposed between the first dummy pattern 215 and the second dummy pattern 225, the circuit film CF may be easily detached from the display device. In the display device, when the circuit film CF is detached from the display device, only the second insulating pattern 220 may be detached together. Accordingly, peeling of the first dummy pattern 215 and peeling of the second dummy pattern 225 may be prevented.

In one embodiment, the signal line 205, the first insulating pattern 210, the first dummy pattern 215, the second insulating pattern 220, and the second dummy pattern 225 may be disposed on a same layer.

The third insulating pattern 230 may be disposed on the signal line 205. The third insulating pattern 230 may overlap the signal line 205. Due to the third insulating pattern 230, when the circuit film CF is detached from the display device, it is possible to prevent the signal line 205 from being peeled off.

The fourth insulating pattern 235 may be disposed on the first dummy pattern 215. The fourth insulating pattern 235 may overlap the first dummy pattern 215. Due to the fourth insulating pattern 235, when the circuit film CF is detached from the display device, peeling of the first dummy pattern 215 may be prevented.

As the third insulating pattern 230 and the fourth insulating pattern 235 are spaced apart from each other, the first pad contact portion PC1 exposing a part of the signal line 205, a part of the first dummy pattern 215, and the first insulating pattern 210 may be formed. The external signal received from the circuit film CF through the first pad contact portion PC1 may be transmitted to the signal line 205.

The first organic pattern 245 may be disposed on the third insulating pattern 230. The first organic pattern 245 may overlap the third insulating pattern 230. The second organic pattern 250 may be disposed on the fourth insulating pattern 235. The second organic pattern 250 may overlap the fourth insulating pattern 235. The first organic pattern 245 and the second organic pattern 250 may include an organic material. As the first and second organic patterns 245 and 250 and the third and fourth insulating patterns 230 and 235 are disposed to overlap each other, moisture penetrating on the display device may be effectively blocked.

The fifth insulating pattern 240 may be disposed on the second dummy pattern 225. The fifth insulating pattern 240 may overlap the second dummy pattern 225. Due to the fifth insulating pattern 240, when the circuit film CF is detached from the display device, peeling of the second dummy pattern 225 may be prevented.

As the fourth insulating pattern 235 and the fifth insulating pattern 240 are spaced apart from each other, the second pad contact portion PC2 exposing a part of the first dummy pattern 215, a part of the second dummy pattern 225, and the second insulating pattern 220 may be formed. When the second pad contact portion PC2 has an opening exposing the second insulating pattern 220, when the circuit film CF is detached from the display device, the first dummy pattern 215 and the second dummy pattern 225 may not be peeled off.

The third organic pattern 255 may be disposed on the fifth insulating pattern 240. The third organic pattern 255 may overlap the fifth insulating pattern 240. The third organic pattern 255 may include an organic material. As the third organic pattern 255 and the fifth insulating pattern 240 are disposed to overlap each other, moisture penetrating on the display device may be effectively blocked.

The conductive pattern 260 may cover the first organic pattern 245, the first insulating pattern 210, the second organic pattern 250, the second insulating pattern 220, and the third organic pattern 255. In an embodiment, the conductive pattern 260 may include zinc oxide. For example, the conductive pattern 260 may be selected from indium zinc oxide ("IZO"), zinc oxide ("ZnO"), and any combination of IZO and ZnO. However, in an embodiment, other materials can be included in the conductive pattern 260. The conductive pattern 260 may prevent the signal line 205 from directly contacting the anisotropic conductive film 270. The conductive pattern 260 may transmit the external signal received from the circuit film CF to the signal line 205.

The anisotropic conductive film 270 may be disposed on the conductive pattern 260. The anisotropic conductive film 270 may connect the conductive pattern 260 and the circuit film CF. The anisotropic conductive film 270 may include conductive balls 265, a single conductive ball 265 being illustrated in FIG. 5 and discussed below. The conductive ball 265 may overlap the signal line 205. After the external signal transmitted from the circuit film CF is transmitted to the conductive pattern 260 through the conductive ball 265, it may be transmitted to the signal line 205. Since the conductive balls 265 overlap only the signal line 205, the external signal may not be transmitted to the first dummy pattern 215 and the second dummy pattern 225.

The circuit film CF may be disposed on the anisotropic conductive film 270. The circuit film CF may receive the external signal. In an embodiment, the integrated circuit IC may be disposed on the circuit film CF. For example, the integrated circuit IC may be disposed on the upper or lower surface of the circuit film CF.

The inventive concepts may be applied to any display device. For example, the inventive concepts may be applied to a mobile phone, a smart phone, a tablet computer, a wearable electronic device, a virtual reality ("VR") device, a television ("TV"), a digital TV, a 3D TV, a personal computer ("PC"), a home appliance, a laptop computer, a personal digital assistant ("PDA"), a portable multimedia player ("PMP"), a digital camera, a music player, a portable game console, a navigation device, etc.

The foregoing is illustrative of embodiments and is not to be construed as limiting thereof. Although a few embodiments have been described, those skilled in the art will readily appreciate that many modifications are possible in the embodiments without materially departing from the novel teachings and features of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
    a substrate including a display area and a peripheral area surrounding the display area;
    a plurality of pads disposed in a first direction of the peripheral area of the substrate and arranged in a second direction perpendicular to the first direction; and
    a circuit film disposed on the pads,
    wherein each of the pads includes:
        a signal line disposed on the substrate;
        a first dummy pattern disposed on the substrate and spaced apart from the signal line in the first direction; and
        a first insulating pattern disposed between the signal line and the first dummy pattern on the substrate, and
        wherein the first insulating pattern of one of the pads is spaced apart from the first insulating pattern of another one of the pads.

2. The display device of claim 1, further comprising:
    a transmission line disposed between the display area and the signal line,
    wherein the transmission line transfers a signal received from the signal line to the display area.

3. The display device of claim 1,
    wherein the signal line, the first dummy pattern, and the first insulating pattern are disposed on a same layer, and
    wherein the first dummy pattern and the signal line comprise a same material.

4. The display device of claim 1,
    wherein the first insulating pattern is disposed on a virtual straight line extending from each of the pads in the second direction.

5. The display device of claim 1, wherein each of the pads extends in the first direction, and has an 'I' shape in which a middle portion of and in the first direction is concave.

6. The display device of claim 1, further comprising:
an integrated circuit disposed on the circuit film.

7. A display device comprising:
a substrate including a display area and a peripheral area surrounding the display area;
a plurality of pads disposed in a first direction of the peripheral area of the substrate and arranged in a second direction perpendicular to the first direction;
a circuit film disposed on the pads,
wherein each of the pads includes:
a signal line disposed on the substrate;
a first dummy pattern disposed on the substrate and spaced apart from the signal line in the first direction; and
a first insulating pattern disposed between the signal line and the first dummy pattern on the substrate;
a second insulating pattern disposed on the signal line;
a first organic pattern disposed on the second insulating layer;
a third insulating pattern disposed on the first dummy pattern;
a second organic pattern disposed on the third insulating pattern; and
a conductive pattern covering the first organic pattern, the first insulating pattern, and the second organic pattern.

8. The display device of claim 7, wherein the conductive pattern comprises zinc oxide.

9. The display device of claim 7,
wherein the second insulating pattern and the first organic pattern overlap the signal line, and
wherein the third insulating pattern and the second organic pattern overlap the first dummy pattern.

10. The display device of claim 7, further comprising:
an anisotropic conductive film disposed between the conductive pattern and the circuit film and including conductive balls,
wherein the conductive pattern and the circuit film are connected by the anisotropic conductive film.

11. The display device of claim 10, wherein the conductive ball and the signal line overlap.

* * * * *